(12) United States Patent
Wu

(10) Patent No.: US 9,379,104 B1
(45) Date of Patent: Jun. 28, 2016

(54) METHOD TO MAKE GATE-TO-BODY CONTACT TO RELEASE PLASMA INDUCED CHARGING

(71) Applicant: GLOBALFOUNDRIES Inc., Grand Cayman (KY)

(72) Inventor: Xusheng Wu, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/639,159

(22) Filed: Mar. 5, 2015

(51) Int. Cl.
| | |
|---|---|
| H01L 21/336 | (2006.01) |
| H01L 21/8234 | (2006.01) |
| H01L 27/06 | (2006.01) |
| H01L 29/78 | (2006.01) |
| H01L 29/861 | (2006.01) |
| H01L 29/66 | (2006.01) |
| H01L 21/265 | (2006.01) |
| H01L 21/266 | (2006.01) |
| H01L 29/06 | (2006.01) |
| H01L 29/423 | (2006.01) |
| H01L 21/84 | (2006.01) |
| H01L 29/417 | (2006.01) |

(52) U.S. Cl.
CPC .......... *H01L 27/0629* (2013.01); *H01L 21/266* (2013.01); *H01L 21/26513* (2013.01); *H01L 21/845* (2013.01); *H01L 29/0653* (2013.01); *H01L 29/41791* (2013.01); *H01L 29/42372* (2013.01); *H01L 29/665* (2013.01); *H01L 29/6609* (2013.01); *H01L 29/66545* (2013.01); *H01L 29/66795* (2013.01); *H01L 29/7851* (2013.01); *H01L 29/861* (2013.01)

(58) Field of Classification Search
CPC ................ H01L 29/41791; H01L 29/66795; H01L 27/0924; H01L 21/823842; H01L 21/845; H01L 27/0629
See application file for complete search history.

(56) References Cited

U.S. PATENT DOCUMENTS

| | | | | |
|---|---|---|---|---|
| 2014/0124863 | A1* | 5/2014 | Cheng ................... | H01L 21/845 257/350 |
| 2014/0151761 | A1* | 6/2014 | Hsieh ................. | H01L 29/66545 257/288 |
| 2014/0187039 | A1* | 7/2014 | Kauerauf .......... | H01L 21/28176 438/658 |
| 2014/0217508 | A1* | 8/2014 | Chang ................... | H01L 29/861 257/350 |
| 2016/0005660 | A1* | 1/2016 | Fan ................... | H01L 29/66136 438/218 |

* cited by examiner

*Primary Examiner* — Jerome Jackson, Jr.
*Assistant Examiner* — Paul Budd
(74) *Attorney, Agent, or Firm* — Ditthavong & Steiner, P.C.

(57) ABSTRACT

Methods for preparing a FinFET device with a protection diode formed prior to M1 formation and resulting devices are disclosed. Embodiments include forming plural fins on a substrate, with a STI region between adjacent fins; forming a dummy gate stack over and perpendicular to the fins, the gate stack including a dummy gate over a dummy gate insulating layer; forming sidewall spacers on opposite sides of the dummy gate stack; forming source/drain regions at opposite sides of the dummy gate stack; forming an ILD over the STI regions between fins; removing the dummy gate stack forming a gate cavity; forming a gate dielectric in the gate cavity; removing the gate dielectric from the gate cavity in a protection diode area, exposing an underlying fin; implanting a dopant into the exposed fin; and forming a RMG in the gate cavity, wherein a protection diode is formed in the protection diode area.

13 Claims, 17 Drawing Sheets

BACKGROUND

METHOD TO MAKE GATE-TO-BODY CONTACT TO RELEASE PLASMA INDUCED CHARGING

TECHNICAL FIELD

The present disclosure relates to the fabrication of fin-type field effect transistor (FinFET) semiconductor devices. In particular, the present disclosure relates to FinFET structures having a protection diode for protecting the device from unwanted current surges during fabrication.

BACKGROUND

Unwanted charges may build up at the gate oxide of a FinFET during plasma processing, such as plasma enhanced chemical vapor deposition (PECVD) and reactive ion etching (RIE), which is used during various stages of FinFET fabrication. FinFET replacement metal gate (RMG) technology has even more complicated processes, and, therefore, is even more susceptible to charge build-up. Specifically, the charge accumulates on a floating metal layer, such as metal gate lines 101 in FIG. 1, which is electrically connected to the gate oxide of transistor 103. That leads to trapped charges which in turn cause yield loss and reliability failures.

Protection diodes, such as diode 105, are widely used for releasing accumulated charge induced breakdown and for protecting the gate dielectric. However, the protection diode is not connected to the gate (e.g. through via contact 107) until the metal 1 (M1) layer 109 is formed. Before the M1 layer, there are many plasma involved processes that can generate unwanted charges that cannot be released. For example 14 nanometer (nm) technology node semiconductor fabrication includes plasma rich middle-of-line (MOL) processes.

A need therefore exists for new methodology enabling fabrication of FinFET devices having protection diodes for releasing unwanted charges accumulated during fabrication and the resulting devices.

SUMMARY

An aspect of the present disclosure relates to a method of forming a FinFET device having a protection diode formed at a RMG step for releasing charges accumulated during plasma rich MOL processes.

Another aspect of the present disclosure relates to a method of forming a FinFET device having a protection diode formed at a trench silicide step for releasing charges accumulated during plasma rich MOL processes.

A further aspect of the present disclosure relates to a device having a protection diode formed at a RMG step or a trench silicide step for releasing charges accumulated during plasma rich MOL processes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming plural fins on a substrate, with a shallow trench isolation (STI) region between adjacent fins; forming at least one dummy gate stack over and perpendicular to the fins, each gate stack including a dummy gate over a dummy gate insulating layer; forming sidewall spacers on opposite sides of each dummy gate stack; forming source/drain regions at opposite sides of each dummy gate stack; forming an interlayer dielectric (ILD) over the STI regions between fins; removing the dummy gate stacks forming gate cavities; forming a gate dielectric in each gate cavity; removing the gate dielectric from a gate cavity in a protection diode area, exposing an underlying fin; implanting a dopant into the exposed fin; and forming a replacement metal gate (RMG) in each gate cavity, wherein a protection diode is formed in the protection diode area.

Aspects of the present disclosure also include forming a mask over the substrate with an opening over the gate cavity in the protection diode area, prior to removing the gate dielectric; and removing the mask after implanting the dopant. Other aspects include the dummy gate insulating layer including an oxide. Still other aspects include implanting the dopant including implanting phosphorus (P), arsenic (As), boron (B), or boron fluoride ($BF_2$). Further aspects include forming a trench silicide on the source/drain regions and forming source/drain and gate contacts through the ILD after forming the RMG. Still further aspects include forming a metal 1 layer over the ILD after forming the source/drain and gate contacts. Additional aspects include forming a second protection diode after forming the metal 1 layer.

Another aspect of the present disclosure includes a method including: forming plural fins on a substrate, with a STI region between adjacent fins; forming dummy gate stacks over and perpendicular to the fins, each gate stack including a dummy gate over a dummy gate insulating layer; forming sidewall spacers on opposite sides of each dummy gate stack; forming source/drain regions at opposite sides of each dummy gate stack; forming an ILD over the STI regions between the dummy gate stacks; removing the dummy gates forming a gate cavity between each pair of sidewall spacers; forming a RMG in each gate cavity; forming first trenches on opposite sides of each RMG; enlarging the first trenches on opposite edges of an RMG in a protection diode area, and forming a second trench over the enlarged first trenches and the RMG therebetween; forming a silicide in the first trenches, including the enlarged first trenches; and filling the first trenches, the enlarged first trenches, and the second trench with metal, forming source/drain and gate contacts, wherein a protection diode is formed in the protection diode area.

Aspects of the present disclosure also include: forming an n-well in the substrate in the protection diode area prior to forming the dummy gate stacks; and forming n-type source/drain regions in the n-well at opposite sides of a dummy gate formed over the n-well. Other aspects include the substrate including a p-type material, the method including forming p-type source/drain regions in the p-type substrate in the protection diode area. Still other aspects include the first and second trenches forming a unitary structure. Further aspects include enlarging the first trenches by removing the sidewall spacers. Still further aspects include forming a metal 1 layer over the ILD after forming the source/drain and gate contacts. Additional aspects include forming a second protection diode after forming the metal 1 layer.

Another aspect of the present disclosure includes a device including: a silicon substrate; first and second silicon fins formed on the substrate; STI regions formed between adjacent first fins, adjacent second fins, and adjacent first and second fins; a metal gate formed over and perpendicular to the first and second fins; source/drain regions formed on the first and second fins at opposite sides of the metal gate; and a protection diode having the metal gate over the second fin.

Aspects of the present disclosure also include a device wherein the substrate includes a p-type substrate, the source/drain regions on the second fin include n-type regions, the device further including an n-well under the metal gate over the second fin and under the source/drain regions on the second fin. Other aspects include a device wherein the substrate includes a p-type substrate, and the source/drain regions on the second fin include p-type regions. Still other aspects include a device including a gate dielectric between the metal gate and the first fins, but no gate dielectric between the metal gate and the second fin, and the second fin is implanted with phosphorus or As or is implanted with B or $BF_2$. Further aspects include a device wherein the metal gate includes a work function metal on the sidewalls and bottom surface of the metal gate, the device further including a merged source/drain and gate contact in contact with the workflow metal on the sidewalls and with a top surface of the metal gate. Additional aspects include a device including an ILD over the metal gate, first and second silicon fins, and source/drain regions; a metal 1 layer over the ILD; and a second protection diode electrically connected to the metal 1 layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of charges building up at a gate oxide attendant upon plasma processing during fabrication of a FinFET, and particularly an RMG for a FinFET. In accordance with the present disclosure, a protection diode is formed either at the RMG step or at the trench silicide step to release accumulated charges.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
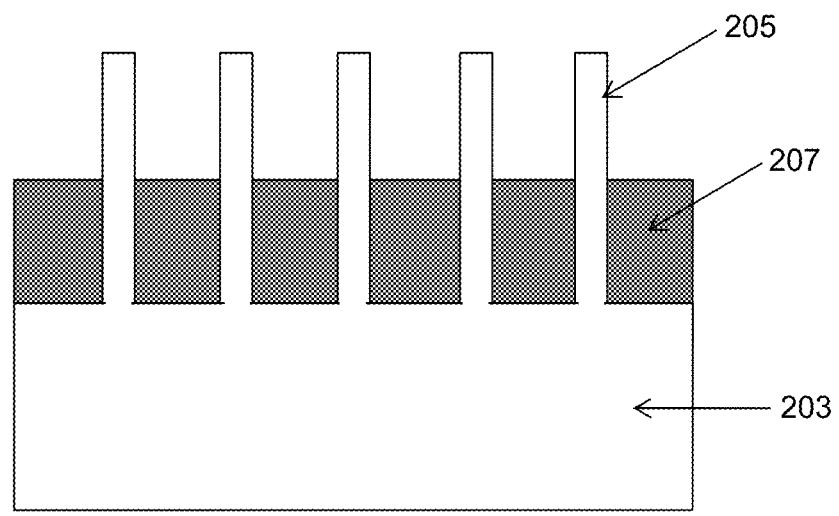
FIGS. 2A, 2C, 2E, 2G, 2I, and 2K schematically illustrate a cross-sectional view of the process flow for fabricating a FinFET device with a protection diode during its fabrication according to an exemplary embodiment.
Figure 2B:
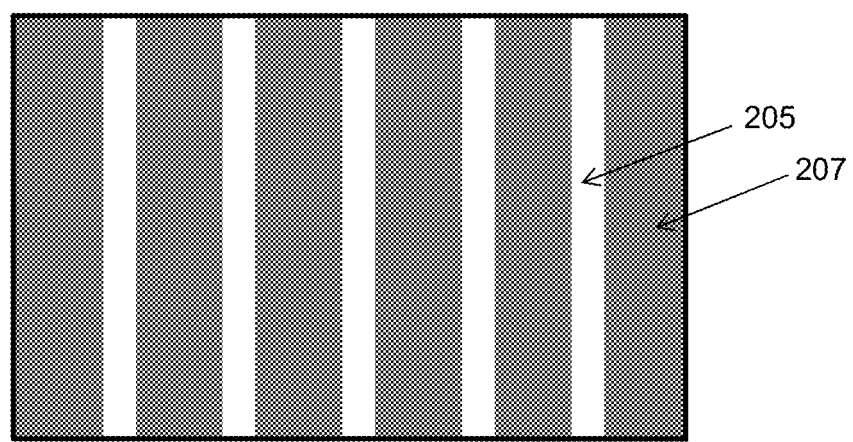
FIGS. 2B, 2D, 2F, 2H, 2J, and 2L schematically illustrate top views of the process flow shown in FIGS. 2A, 2C, 2E, 2G, 2I, and 2K, respectively, according, to an exemplary embodiment.

Referring to FIGS. 2A cross-sectional view) and 2B (top view), on a silicon substrate 203, a plurality of fins 205 and a STI region 207 between adjacent fins are formed by conventional processes. Specifically, a hardmask (not shown for illustrative convenience) is generated with a conventional technique (either by patterning or by spacer techniques) over substrate 203, the silicon substrate is etched through the hardmask to form fins 205, the spaces between the fins are filled with STI oxide, which is planarized by chemical mechanical polishing (CMP) to stop at the hardmask, and the hardmask is removed. The hardmask removal is then followed by n and p well formation (not shown for illustrative convenience) by well patterning, n/p implantation, and annealing.

Figure 2C:
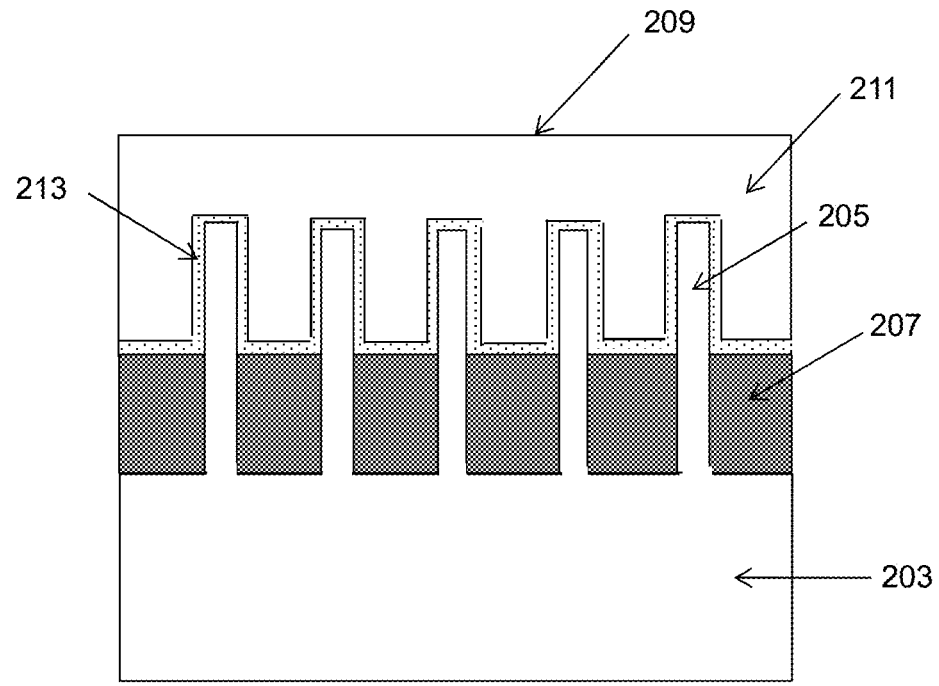
Figure 2D:
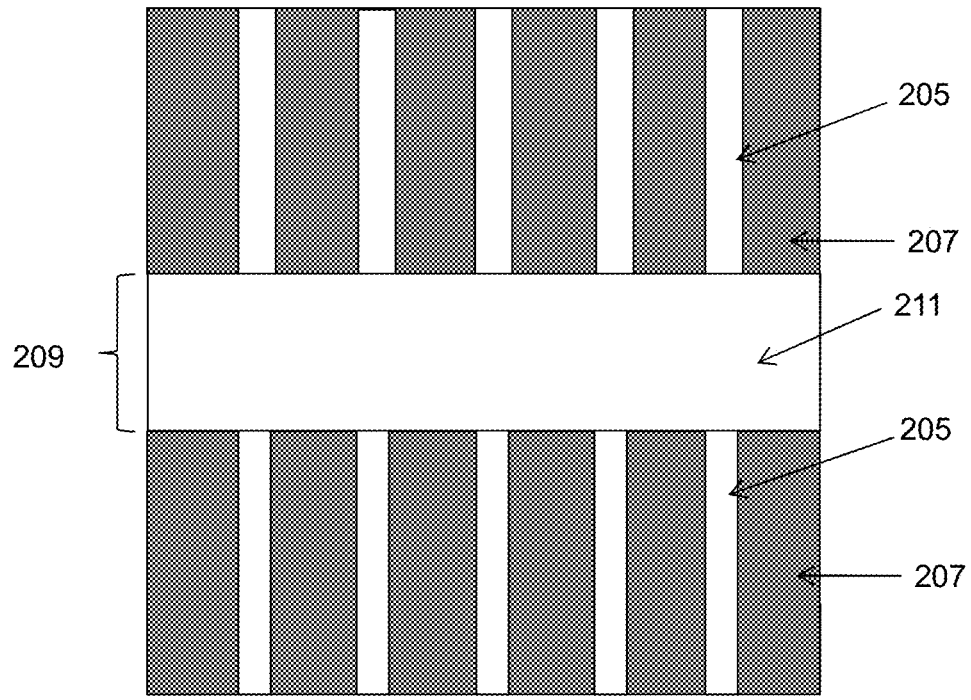

Adverting to FIGS. 2C (cross-sectional view) and 2D (top view), a dummy gate stack 209 is formed over and perpendicular to the fins 205. The dummy gate stack 209 includes a dummy gate electrode 211 over a dummy gate insulating layer 213. The dummy gate electrode 211 may be formed of, for example, polysilicon or amorphous silicon by conventional processes. The dummy gate insulating layer 213 may be formed of for example, an oxide such as silicon dioxide, also by conventional processes.

Figure 2E:
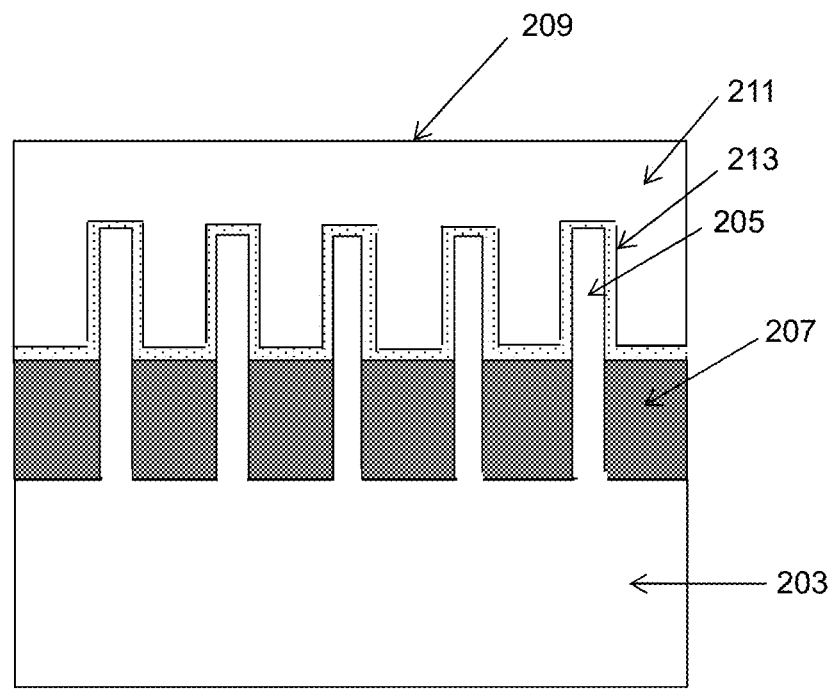
Figure 2F:
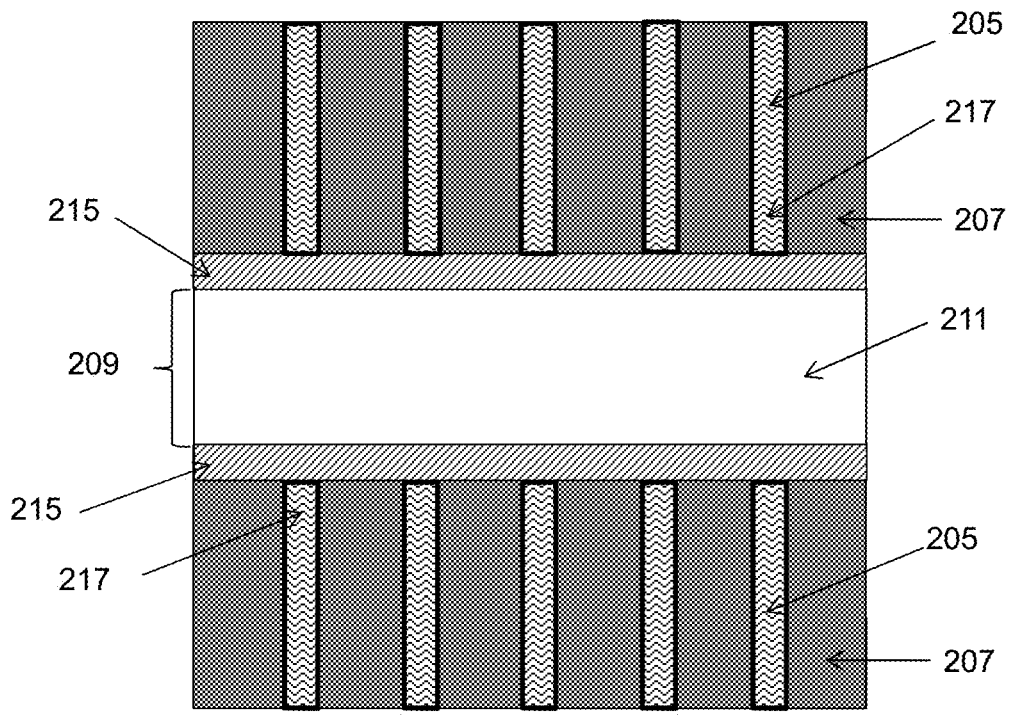

As illustrated in FIGS. 2E (cross-sectional view) and 2F (top view), sidewall spacers 215 are formed on opposite sides of each dummy gate electrode 211 (a cut-away view of sidewall spacer 215 is shown in FIG. 2E for illustrative convenience). After the sidewall spacers 215 are formed, one or more ion implantation processes may be performed to introduce dopant materials (n-type or p-type dopants depending upon the device) to form halo regions. Further, embedded silicon germanium (eSiGe) (for p-type source/drain regions) and silicon (for n-type raised source/drain regions) may be epitaxially grown on the fins at opposite sides of the gate electrode with respective p+ or n+ implantation or in situ doping to form source/drain regions 217.

Figure 2G:
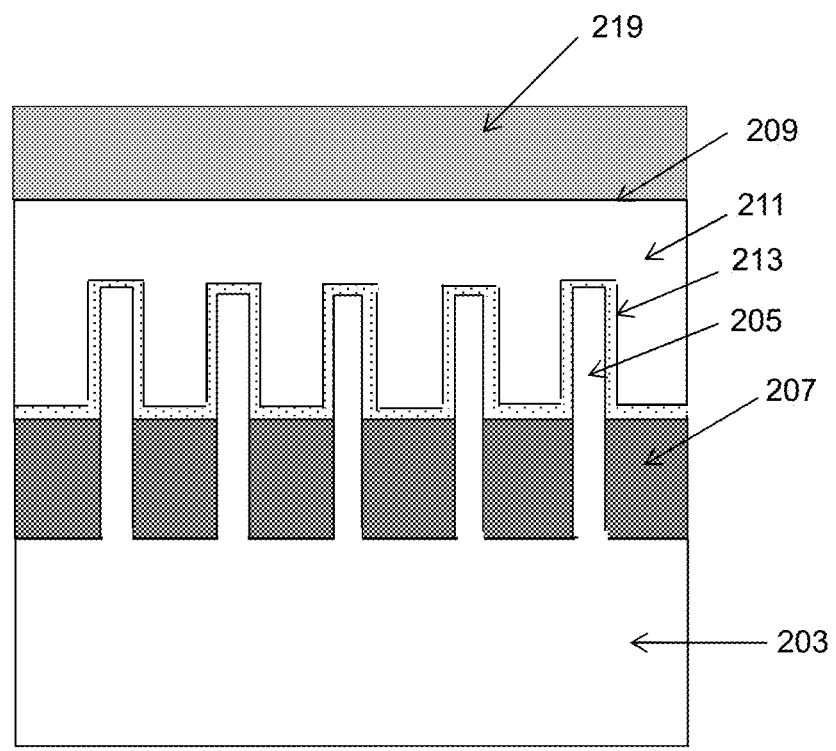
Figure 2H:
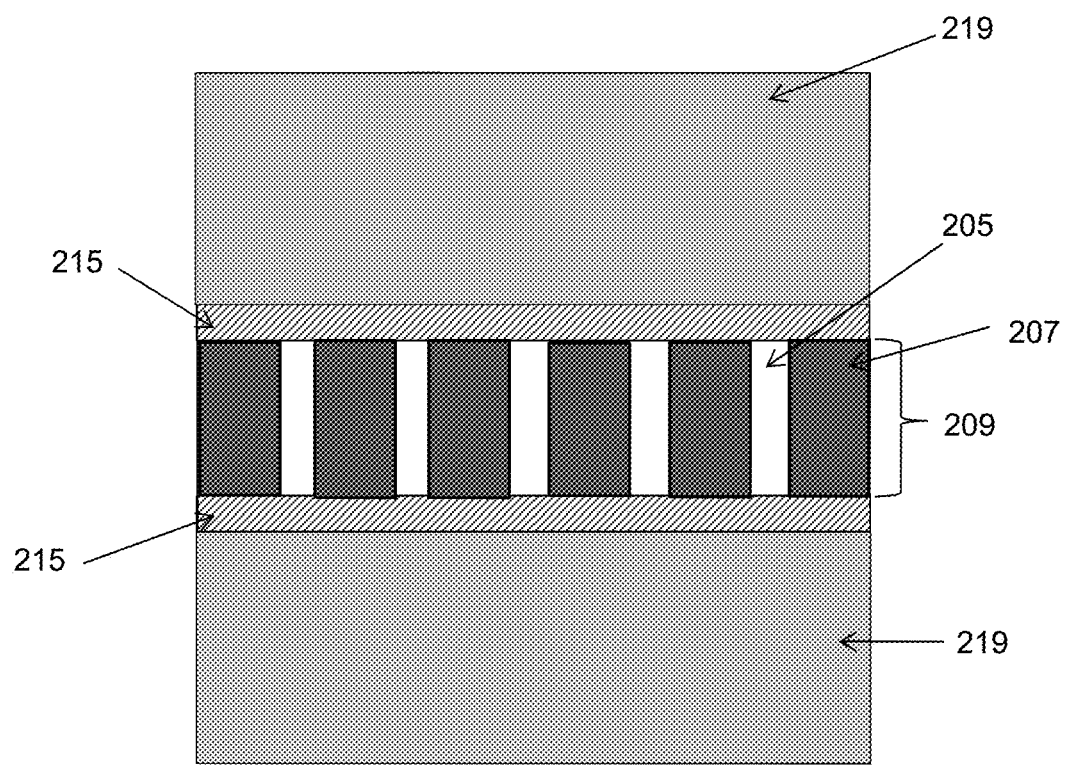

Adverting FIGS. 2G (cross-sectional view) and 2H (top an IL 219 is deposited over the dummy gate stack 209 including the dummy gate electrode 211, the dummy gate insulating layer 213, the fins 205, and the STI regions 207. The ILD 219 may be formed of, for example, silicon dioxide. ILD 219 is then planarized by CMP, exposing gate stack 209 as shown in FIG. 2H.

Figure 2I:
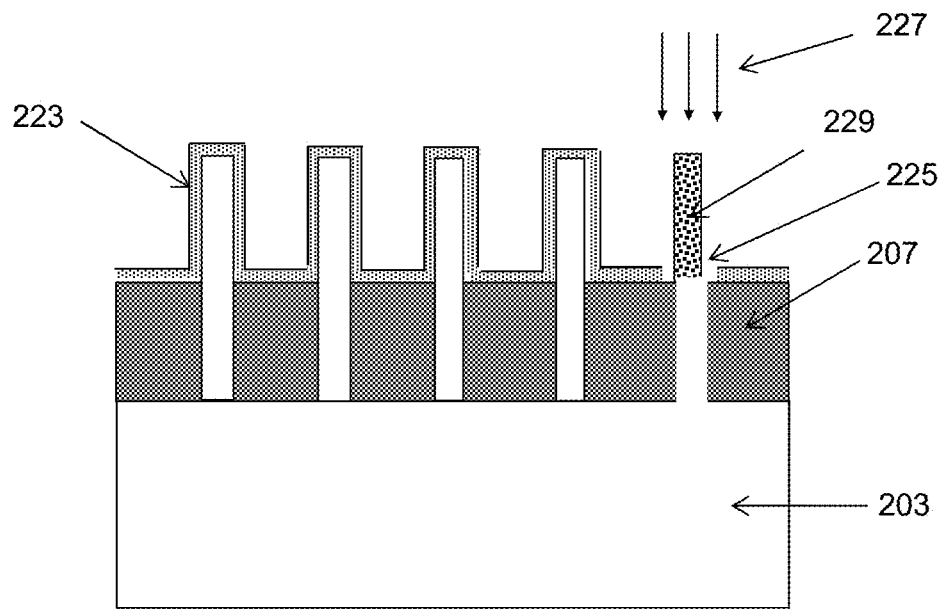
Figure 2J:
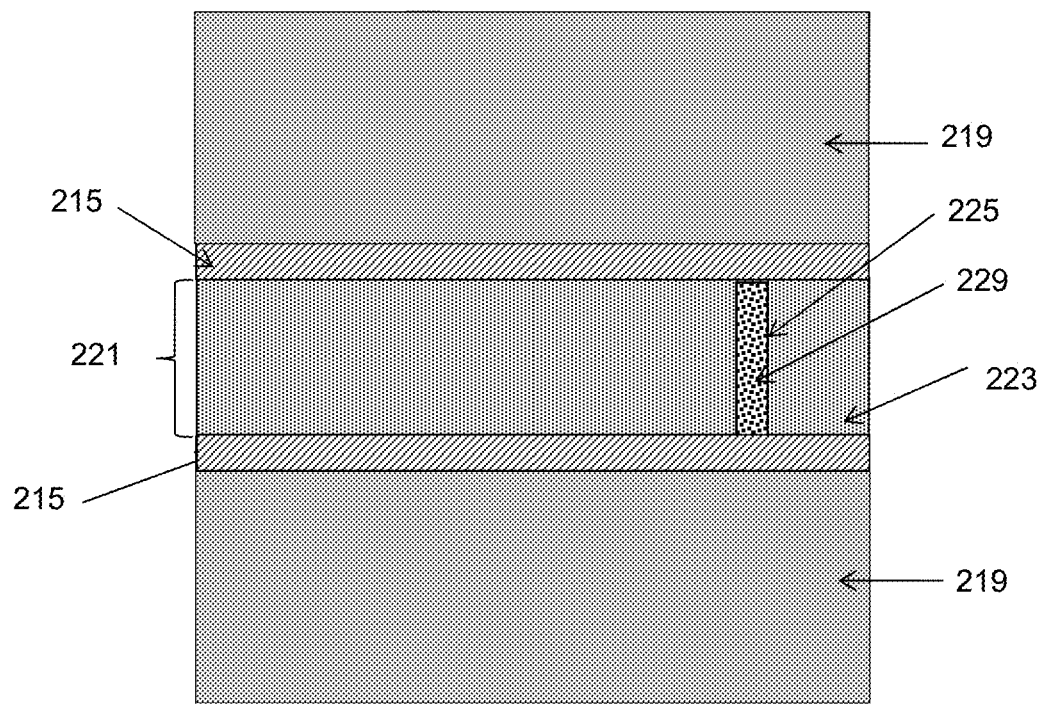

As illustrated in FIG. 2I (cross-sectional view) and FIG. 2J (top view) the dummy gate stack 209 including the dummy gate electrode 211 and dummy gate insulating layer 213 are removed, e.g. by etching, forming gate cavity 221 between spacers 215. A high-k dielectric 223 is then deposited. A mask (not shown for illustrative convenience) is then formed over the substrate with an opening over the gate cavity 221 in the protection diode area 225, and the high-k dielectric 223 is removed from the protection diode area 225, exposing a fin 205. The exposed fin in the protection diode area 225 is then implanted with a dopant 227, e.g. a p-type dopant such as B or $BF_2$, or an n-type dopant such as P or As, to form the protection diode 229. The implant B (or $BF_2$) or P (or As) is associated with the protection diode 229 substrate. If the substrate is an n-type substrate, then an implant of B (or $BF_2$) is needed to form a p-n junction; and if the substrate is a p-type substrate, then an implant of P (or As) is needed to form a n-p junction for the diode 229.

Figure 2K:
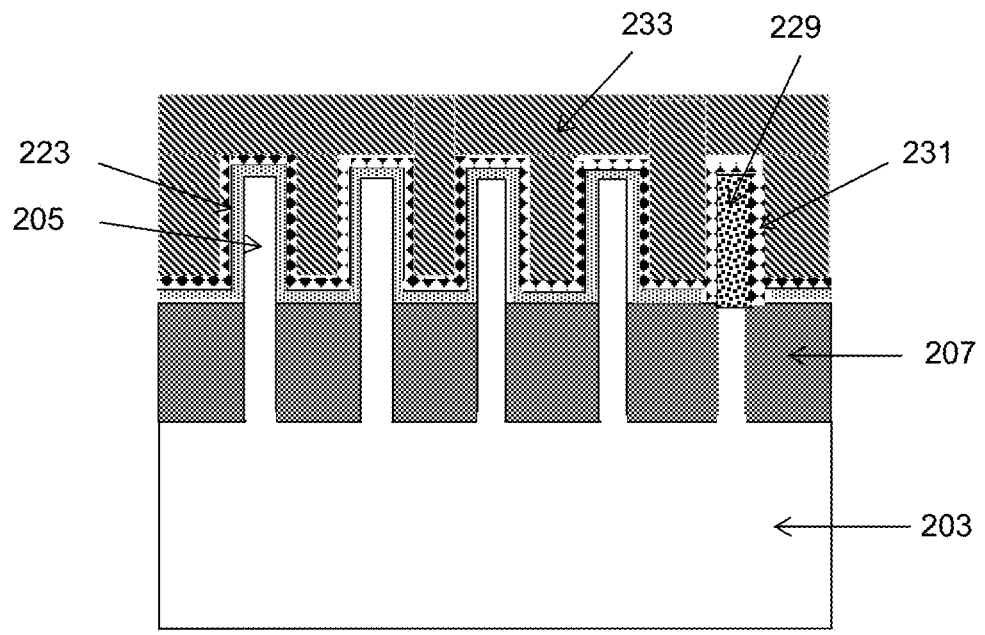
Figure 2L:
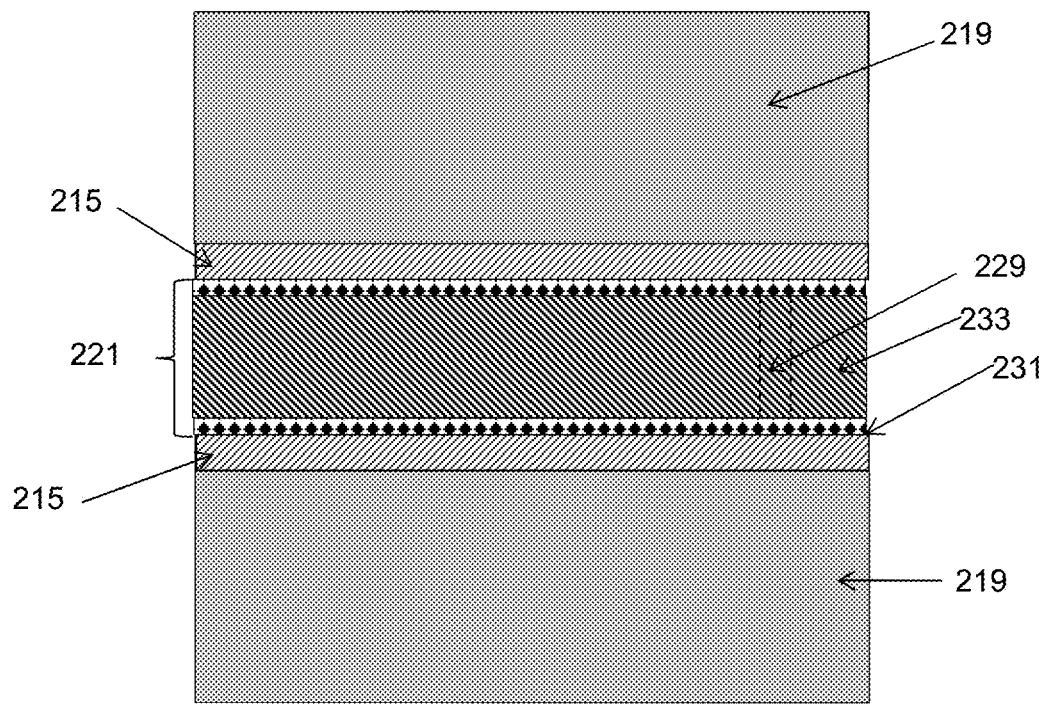

As shown in FIG. 2K (cross-sectional view) and FIG. 2L (top view), the RMG process continues with depositing a work function metal 231 and metal fill 233 in the gate cavity 219. After metal fill 233, CMP may be used to polish the surface. The work function metal 231, metal fill 233, and high-k dielectric 223 on top of the ILD 219 are also polished away. By this CMP, only the gate area has metal and gate stack.

A silicide trench may then be formed through the ILD down to the source/drain regions, and a nickel silicide may be formed in the trench, e.g. by depositing nickel and annealing. Contacts may then be formed by filling the silicide trenches with tungsten. A metal 1 layer may be formed over the ILD material and interconnected with the contacts and after forming the source/drain and gate contacts. As a result, a protection diode is formed, connected to the metal 1 layer, for releasing charge on the gate even before M1 formation.

Figure 1:
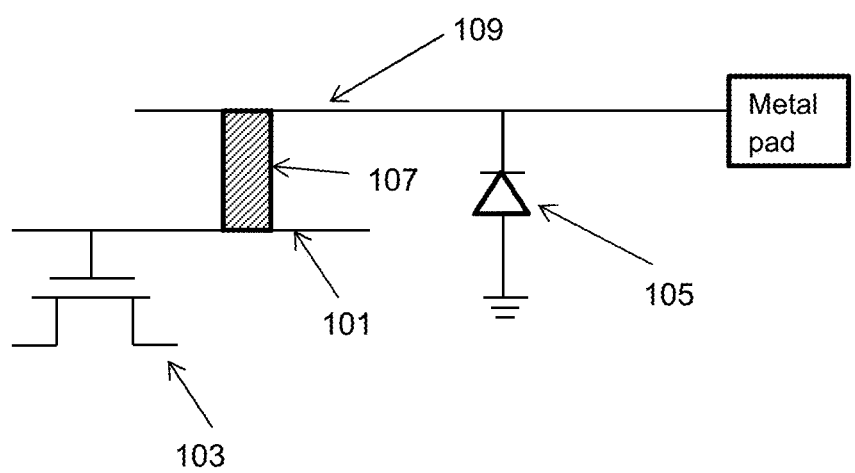
FIG. 1 schematically illustrates a circuit diagram of a semiconductor device with a protection diode connected to the M1 layer.
Figure 2M:
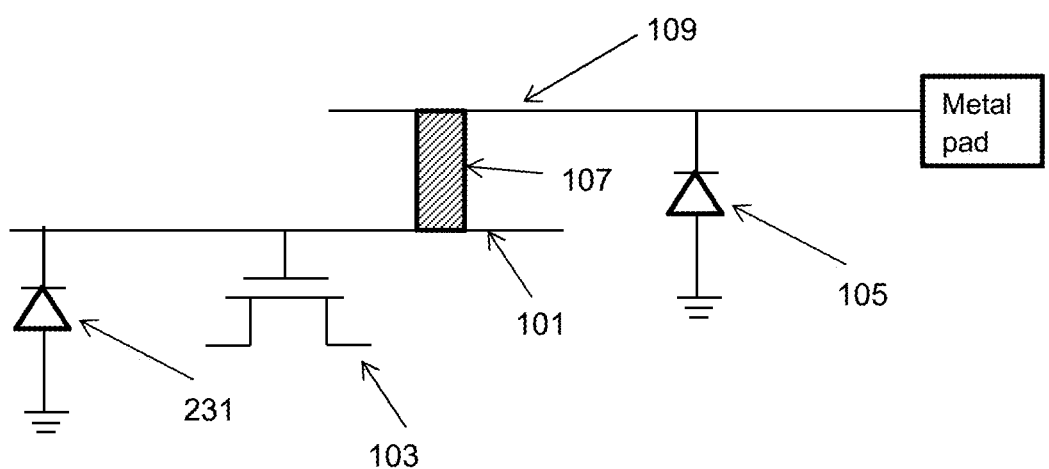
FIG. 2M schematically illustrates a circuit diagram of a semiconductor device as illustrated in FIG. 1, with an additional protection diode connected to the M1 layer formed in accordance with the embodiments of FIGS. 2A through 2L.

An additional protection diode may be formed after forming the M1 layer, as in the prior art. FIG. 2M illustrates a circuit diagram of a semiconductor device as illustrated in FIG. 1 with an additional protection diode 231 formed according the embodiment of FIGS. 2A through 2L. In another embodiment, a protection diode may be formed after forming the M1 layer, during a trench silicide step.

Figure 3A:
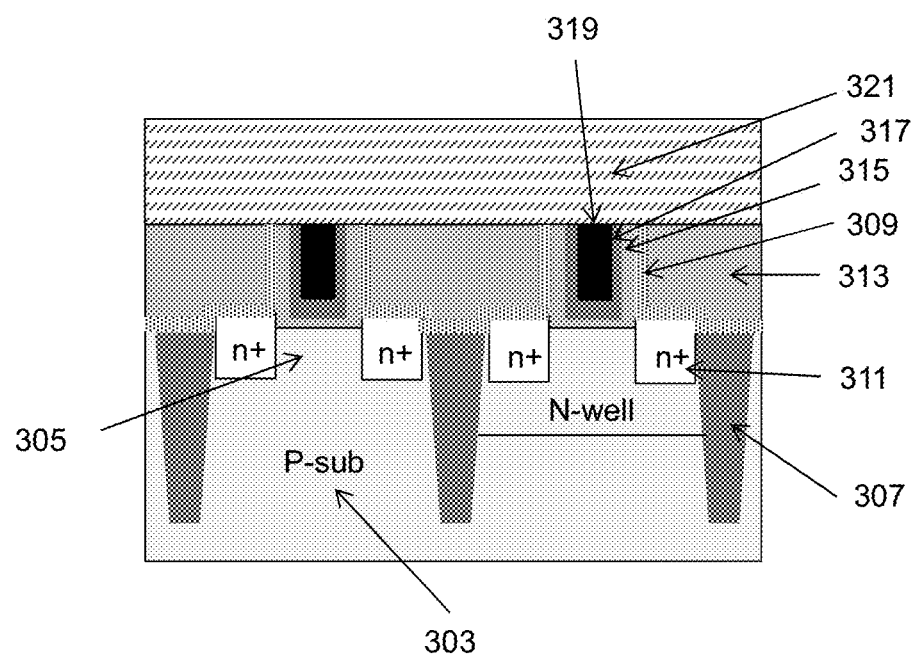
FIGS. 3A, 3B, 3D, and 3F schematically illustrate a cross-sectional view of the process flow for fabricating a FinFET device with a protection diode during its fabrication according to an exemplary embodiment.

Adverting to FIG. 3A, on a p-type substrate 303, for example, fins 305 and STI regions 307 between the fins are formed by conventional processes. Specifically, a hardmask (not shown for illustrative convenience) is generated with a conventional technique (either by patterning or by spacer techniques) over substrate 303, the silicon substrate is etched through the hardmask to form fins 305, the spaces between the fins are filled with STI oxide, which is planarized by CMP to stop at the hardmask, and the hardmask is removed. The hardmask removal is then followed by n and p well formation (not shown for illustrative convenience) by well patterning, n/p implantation, and annealing.

A dummy gate stack (not shown for illustrative convenience, but the same as in the first embodiment) is formed over and perpendicular to the tins 305. The dummy gate stack includes a dummy gate electrode over a dummy gate insulating layer. Spacers 309 are formed on opposite sides of each dummy gate electrode. One or more ion implantation processes may be performed to introduce dopant materials (n-type or p-type dopants depending upon the device) to form halo regions. Further, embedded silicon germanium (eSiGe) (for p-type source/drain regions) and silicon (for n-type raised source/drain regions) may be epitaxially grown on the fins at opposite sides of the gate electrode with respective p+ or n+ implantation or in situ doping to form source/drain regions 311 and an n-p junction for diode formation. The n+ and N-well are considered as n-type; and the P-substrate is p-type. N+ regions are illustrated in FIG. 3A.

An ILD 313 is then deposited and planarized, e.g. by CMP, down to the dummy gate electrode, which is in turn removed along with the dummy gate insulating layer, e.g. by etching. A high-k dielectric 315, work function metal 317, and metal fill 319 may then be formed in the cavities that have been formed between sidewall spacers 309 from the removal of the dummy gate stack to form a RMG. The device is then covered with another ILD 321.

Figure 3B:
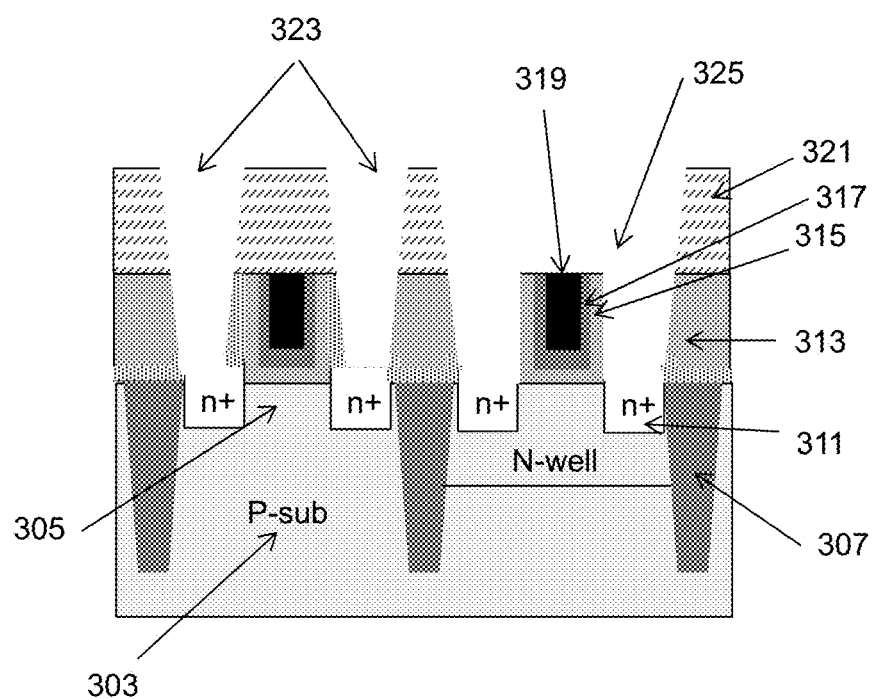
Figure 3C:
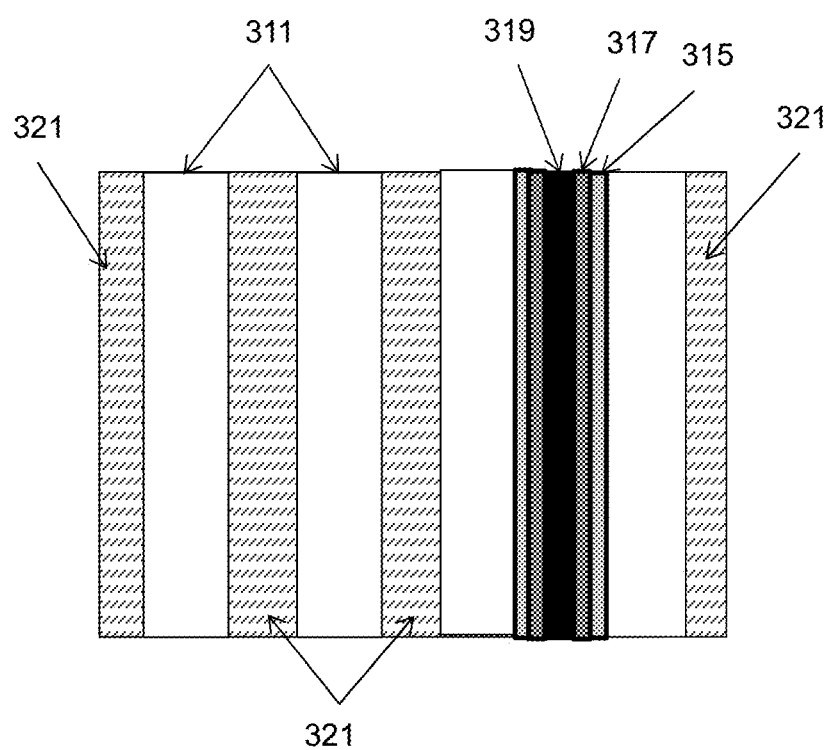
FIGS. 3C, 3E, and 3G schematically illustrate top views of the process flow shown in FIGS. 3B, 3D, and 3F, respectively, according to an exemplary embodiment.

Referring next to FIG. 3B (cross-sectional view) and FIG. 3C (top view), trenches 323 are patterned and etched over the source/drain regions 311 on each side of the RMG. In the protection diode region, a trench 325 is formed covering both the source/drain regions 311 and the RMG. The trench 325 is enlarged at the gate edges, removing the sidewall spacers 309.

Figure 3D:
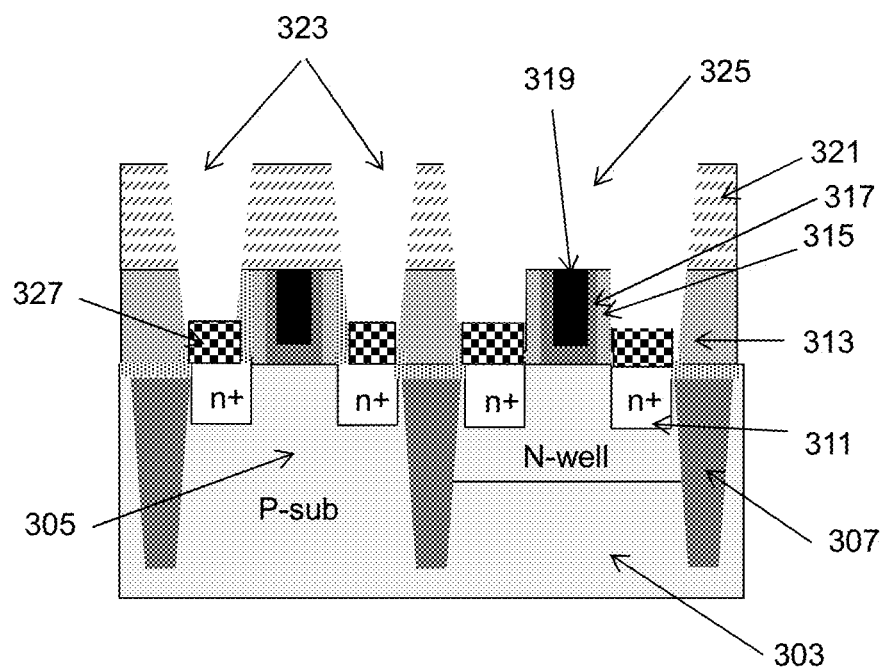
Figure 3E:
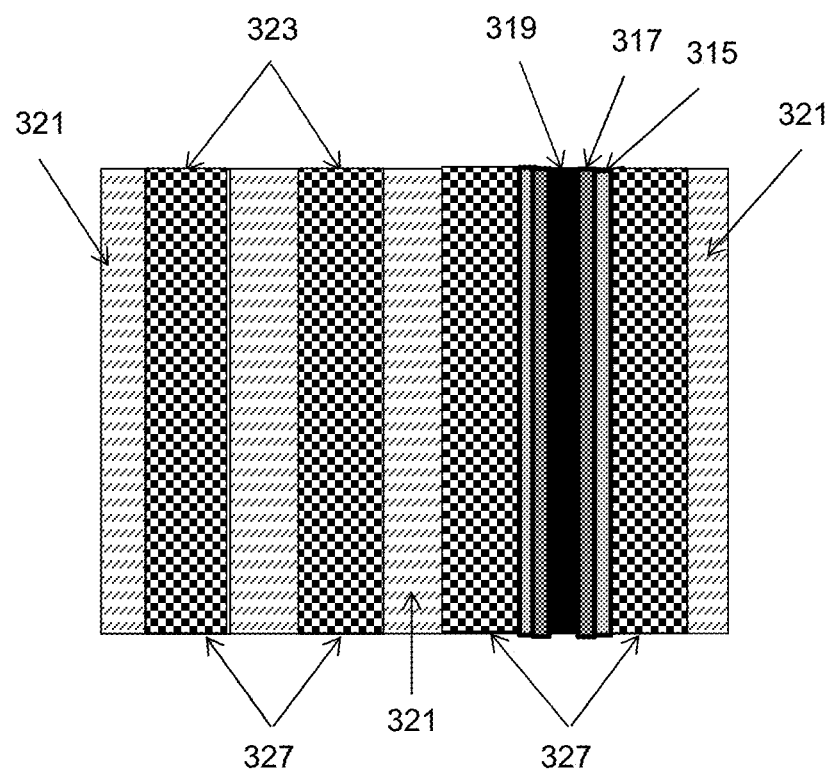

As illustrated in FIG. 3D (cross-sectional view) and FIG. 3E (top view), a silicide 327 is formed in each of the trenches 323 and 325 over the source/drain regions 311. The silicide 327 may be formed in the trenches 323 and 325, e.g. by depositing nickel and annealing to form NiSi.

Figure 3F:
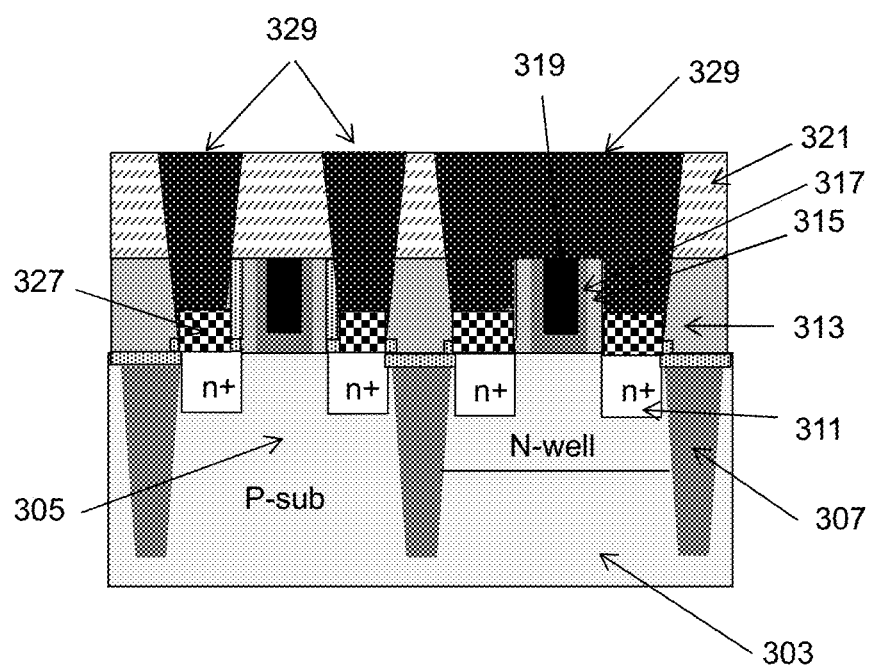
Figure 3G:
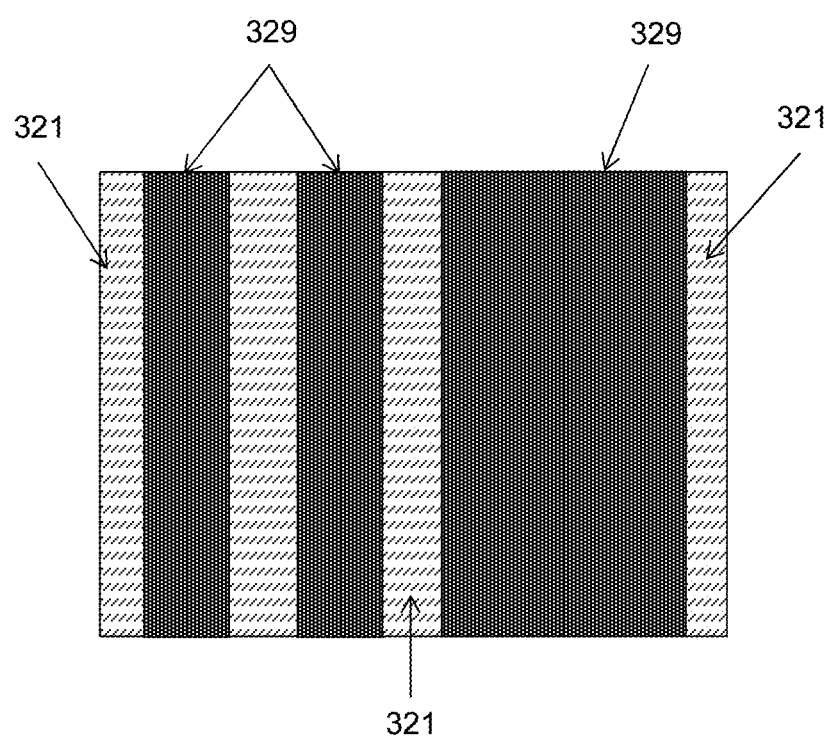

Referring next to FIG. 3F (cross-sectional view) and FIG. 3G (top view), each of trenches 323 and 325 is filled with a metal, for example, tungsten (W), over the silicide 327, thereby forming the source/drain and gate contacts 329. The source/drain and gate contacts are connected for the protection diode. The n+ is connected to its gate through TS (tungsten metal), and the gate is connected to transistor gate as shown in the layout in FIG. 3H. The transistor is connected to the n-p junction to form the protection diode. The standard transistor on the left can have a gate connected to the gate of the protection diode on the right allowing the transistor gate to be connected to the protection diode after the trench silicide formation step. A M1 layer (not shown for illustrative convenience) may then be formed over the ILD 321.

The process flow for fabricating a FinFET device with a protection diode during its fabrication is shown in FIG. 3A to 3G. This process provides an embodiment for connecting the gate of a transistor to a protection diode through the trench formation step before an M1 step.

Figure 3H:
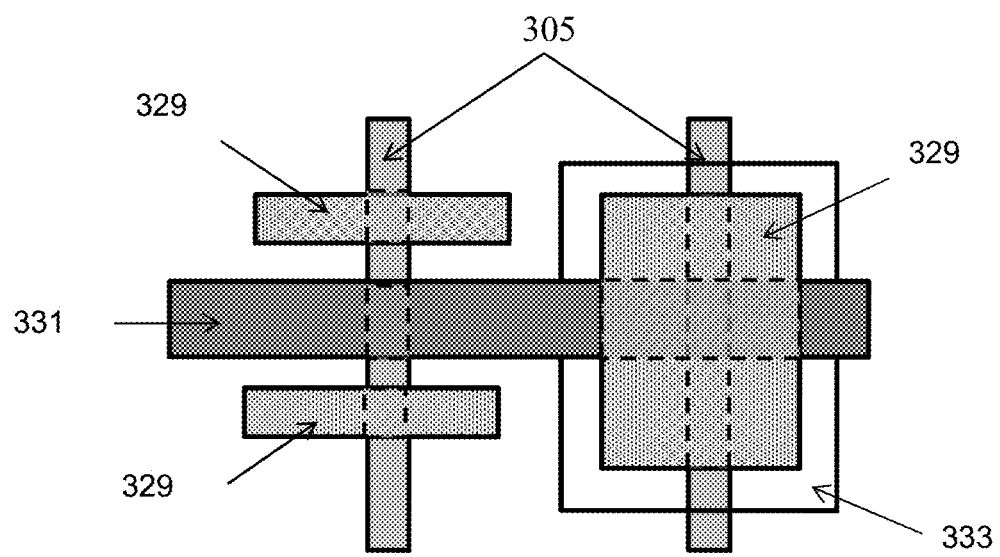
FIG. 3H schematically illustrates a top view of electrical connections for the device resulting from the process flow shown in FIGS. 3A through 3G according to another exemplary embodiment.

Referring next to FIG. 3H (top view), the gate contact 329 (on the right side of the drawing) is shown across the gate 331, n well 333 below the protection diode, and fins 305. The source/drain contacts 329 (on the left side of the drawing) are on opposite sides of gate 331. In FIG. 3H, the device on the left is a standard transistor and the device on the right is a protection diode. The particular types of doping (i.e., p versus n) are shown as an example. For the transistor and protection diode device, source/drain doping can be n+ or p+ depending on the transistor type. For the well doping of the standard transistor (on the left of FIG. 3H), n+ source/drains need to have an p type well and p+ source/drains need to have a n type well. For the well doping of the protection diode device (on the right of FIG. 3H), n+ or p+ source/drains can be on n type well or p type well depending on the p-n junction design. For example, if n+ source/drain on p type well, it can form n-p junction; if n+ source/drain on n type well but it has p type well under, it can form n-p junction as well. Then the transistor and protection diode devices can connect their source/drains to the gate and generate a p-n junction for diode formation.

The embodiments of the present disclosure can achieve several technical effects, such as discharging charges accumulated during fabrication of a semiconductor device as early as the beginning gate step with the addition of only one mask or during a trench silicide step with the modification of an existing mask, thereby increasing yield and/or reliability. Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices, particularly for 20 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming plural fins on a substrate, with a shallow trench isolation (STI) region between adjacent fins;
   forming at least one dummy gate stack over and perpendicular to the fins, each gate stack including a dummy gate over a dummy gate insulating layer;
   forming sidewall spacers on opposite sides of each dummy gate stack;
   forming source/drain regions at opposite sides of each dummy gate stack;
   forming an interlayer dielectric (ILD) over the STI regions between fins;
   removing the dummy gate stacks forming gate cavities;
   forming a gate dielectric in each gate cavity;
   removing the gate dielectric from a gate cavity in a protection diode area, exposing an underlying fin, wherein a protection diode is formed in the protection diode area;
   implanting a dopant into the exposed fin;
   forming a replacement metal gate (RMG) in each gate cavity;
   forming a metal 1 layer over the ILD; and
   forming a second protection diode after forming the metal 1 layer.

2. The method according to claim 1, further comprising:
   forming a mask over the substrate with an opening over the gate cavity in the protection diode area, prior to removing the gate dielectric; and
   removing the mask after implanting the dopant.

3. The method according to claim 1, wherein the dummy gate insulating layer comprises an oxide.

4. The method according to claim 1, wherein implanting a dopant comprises implanting phosphorus (P), arsenic (As), boron (B), or boron fluoride ($BF_2$).

5. The method according to claim 1, further comprising forming a trench silicide on the source/drain regions and forming source/drain and gate contacts through the ILD after forming the RMG.

6. The method according to claim 5, wherein the metal 1 layer is formed after forming the source/drain and gate contacts.

7. A method comprising:
   forming plural fins on a substrate, with a shallow trench isolation (STI) region between adjacent fins;
   forming dummy gate stacks over and perpendicular to the fins, each gate stack including a dummy gate over a dummy gate insulating layer;
   forming sidewall spacers on opposite sides of each dummy gate stack;
   forming source/drain regions at opposite sides of each dummy gate stack;
   forming an interlayer dielectric (ILD) over the STI regions between the dummy gate stacks;
   removing the dummy gates forming a gate cavity between each pair of sidewall spacers;
   forming a replacement metal gate (RMG) in each gate cavity;
   forming first trenches on opposite sides of each RMG;
   enlarging the first trenches on opposite edges of an RMG in a protection diode area, and forming a second trench over the enlarged first trenches and the RMG therebetween;
   forming a silicide in the first trenches, including the enlarged first trenches; and
   filling the first trenches, the enlarged first trenches, and the second trench with metal, forming source/drain and gate contacts,
   wherein a protection diode is formed in the protection diode area.

8. The method according to claim 7, further comprising:
   forming an n-well in the substrate in the protection diode area prior to forming the dummy gate stacks; and
   forming n-type source/drain regions in the n-well at opposite sides of a dummy gate formed over the n-well.

9. The method according to claim 7, wherein the substrate comprises a p-type material, the method comprising forming p-type source/drain regions in the p-type substrate in the protection diode area.

10. The method according to claim 7, wherein the first and second trenches form a unitary structure.

11. The method according to claim 7, wherein enlarging the first trenches comprises removing the sidewall spacers.

12. The method according to claim 7, further comprising forming a metal 1 layer over the ILD after forming the source/drain and gate contacts.

13. The method according to claim 12, further comprising forming a second protection diode after forming the metal 1 layer.

* * * * *